United States Patent [19]
Dantsker et al.

[11] Patent Number: 6,023,161
[45] Date of Patent: Feb. 8, 2000

[54] LOW-NOISE SQUID

[75] Inventors: Eugene Dantsker, Torrance; John Clarke, Berkeley, both of Calif.

[73] Assignee: The Regents of the University of California, Oakland, Calif.

[21] Appl. No.: 09/032,171

[22] Filed: Feb. 27, 1998

Related U.S. Application Data

[60] Provisional application No. 60/038,538, Feb. 28, 1997.

[51] Int. Cl.$^7$ .......................... G01R 33/02; G01R 33/035
[52] U.S. Cl. ............................ 324/248; 505/846; 505/162
[58] Field of Search ............................ 324/248; 505/845, 505/846, 160, 162; 257/31–36

[56] References Cited

U.S. PATENT DOCUMENTS

| | | | |
|---|---|---|---|
| 5,532,485 | 7/1996 | Bluzer et al. | 505/848 |
| 5,625,290 | 4/1997 | You | 324/248 |

OTHER PUBLICATIONS

R. Cantor, et al. "Low–Noise, Single–Layer $YBa_2Cu_3O_{7-x}$ DC SQUID Magnetometers at 77 K", IEEE Transactions on Applied Superconductivity, vol. 5, No. 2, Jun. 1995, pp. 2927–2930.

Dantsker, et al. Addendum: "Low Noise $YBa_2Cu_3O_{7-x}$–$SrTiO_3$–$YBa_2Cu_3O_{7-x}$ Multilayers for Improved Superconducting Magnetometers", Appl. Phys. Lett. 67(5), Jul. 31, 1995, pp. 725–726.

Drung, et al. "Integrated $Yba_2Cu_3O_{7-x}$ Magnetometer for Biomagnetic Measurements", Appl. Phys. Lett. 68 (10), Mar. 4, 1996, pp. 1421–1423.

Dantsker, et al. "High-$T_c$ Super Conducting Quantum Interference Devices with Slots or Holes: Low 1/f Noise in Ambient Magnetic Fields", Appl. Phys. Lett. 70 (15), Apr. 14, 1997, pp. 2037–2039.

*Primary Examiner*—Jay Patidar
*Attorney, Agent, or Firm*—Coudert Brothers

[57] ABSTRACT

The present invention comprises a high-transition-temperature superconducting device having low-magnitude low-frequency noise-characteristics in magnetic fields comprising superconducting films wherein the films have a width that is less than or equal to a critical width, $w_C$, which depends on an ambient magnetic field. For operation in the Earth's magnetic field, the critical width is about 6 micrometers ($\mu$m). When made with film widths of about 4 $\mu$m an inventive high transition-temperature, superconducting quantum interference device (SQUID) excluded magnetic flux vortices up to a threshold ambient magnetic field of about 100 microTesla ($\mu$T). SQUIDs were fabricated having several different film strip patterns. When the film strip width was kept at about 4 $\mu$m, the SQUIDs exhibited essentially no increase in low-frequency noise, even when cooled in static magnetic fields of magnitude up to 100 $\mu$T. Furthermore, the mutual inductance between the inventive devices and a seven-turn spiral coil was at least 85% of that for inductive coupling to a conventional SQUID.

34 Claims, 9 Drawing Sheets

LOW-NOISE SQUID

This invention is disclosed in and claims benefit of provisional application Ser. No. 60/038,538, filed on Feb. 28, 1997, and incorporated herein by reference.

This invention was made with U. S. Government support under Contract No. DE-AC03-76SF00098 between the U.S. Department of Energy and the University of California for the operation of Lawrence Berkeley Laboratory. The U. S. Government may have certain rights in this invention.

I. BACKGROUND OF THE INVENTION

1. Field of the Invention

This invention relates generally to superconducting quantum interference devices (SQUIDs) and more specifically to high-transition-temperature, low-noise SQUIDs.

2. Description of Related Art

Superconducting quantum interference devices (SQUIDs) are used to detect magnetic flux. They transduce magnetic flux into voltage. The SQUID is used for a range of applications in which low level physical phenomena are readily converted to magnetic flux. For example, current, voltage, magnetic field, and magnetic field gradient can all be measured via magnetic flux. High transition temperature (high-$T_C$) SQUIDs are those made with materials having a transition temperature above the boiling point of liquid nitrogen (77 K). Low-transition temperature (low-$T_C$) SQUIDs are those made with materials having a transition temperature below the boiling point of liquid nitrogen (77 K). A SQUID's usefulness is limited primarily by its intrinsic noise, the ability to efficiently couple a signal to it, and by the ability to read out a signal.

Magnetometers based on low-$T_C$ SQUIDs exhibit extremely high sensitivity, broad bandwidth (up to tens of GigaHz), and small physical size. However the low temperature requirement, necessitating liquid helium, makes low-$T_C$ SQUIDs expensive and cumbersome to use. It would thus be very desirable to fabricate high-$T_C$ SQUIDs that had some of the desirable performance characteristics of the low-$T_C$ counterparts. Unfortunately, however, in high-$T_C$ SQUIDs the level of 1/f noise tends to be impractically high, particularly when cooled and operated in the presence of a magnetic field, even one as small as the Earth's ambient magnetic field, which is about 50 $\mu$T.

Miklich et al. Found that the 1/f flux noise at low frequencies (f) increased substantially when SQUIDs were cooled in static magnetic fields comparable to that of the Earth (A. H. Miklich et al., Appl. Phys. Lett. 64:3494, 1994). Because the spectral density of the flux noise scales linearly with the magnitude of the ambient magnetic field, B, the noise is attributed to the thermally activated hopping of vortices among pinning sites in the high-$T_C$ superconducting film (M. J. Ferrari et al., J. Low Temp. Phys. 94:15, 1994).

Excess noise has been a serious limitation for SQUID-based devices. Noise arises from two sources. First, there is ambient noise arising from a variety of sources, such as power lines or electrical appliances, in the environment. Second, there is noise that arises from magnetic flux vortices penetrating a superconducting film as it is cooled in a static ambient magnetic field. Low levels of noise have only been achieved by surrounding the SQUID magnetometer with magnetic shielding that reduced the ambient magnetic field to below 1 $\mu$T. To achieve very low noise levels magnetic shielding must be used, for example, as provided by The Berlin Magnetically Shielded Room (BMSR). The room was designed to provide electromagnetic shielding at frequencies from dc to Ghz. The BMSR is a cube with inner dimensions of 2.25 m×2.25 m×2.25 m and outer dimensions of 4.6 m×4.6 m×4.6 m. The shielding is provided by six layers of high permeability alloy and an eddy current shield of copper plates. Another type of static magnetic field shielding structures is a multi-layered mu-metal shield. Using these types of shielding apparatus, the most sensitive magnetometers have achieved magnetic field noise levels at about 30 fT Hz$^{-1/2}$ at 1 Hz (R. Cantor et al., IEEE Trans. Appl. Supercond., 5:2927, 1995; E. Dantsker et al., Appl. Phys. Lett., 67:725, 1995), and at about 10 fT Hz$^{-1/2}$ at frequencies higher than the onset of 1/f problems, (D. Drung et al., Appl. Phys. Lett., 68:1421, 1996).

Development of high-$T_C$ SQUIDs which excluded magnetic flux vortices when cooled and operated in the Earth's magnetic field would be a particularly important advance in the art.

II. SUMMARY OF THE INVENTION

It is an object of this invention to provide high-$T_C$ superconducting devices, for example SQUIDs, that exhibit very low 1/f noise when cooled and operated, in the presence of a magnetic field. Since cooling the devices is necessary for their operation, all future reference to device operation includes the cooling step. It is a further object of the present invention to provide low-noise high-$T_C$ SQUIDS in which there is no loss in signal pick-up capability or magnetic-field sensitivity. The present invention is useful for SQUIDs having a single superconducting layer and for SQUIDs having multiple superconducting layers.

The present invention comprises a high-transition-temperature (high-$T_C$)superconducting device for operation in an ambient magnetic field, the device comprising a superconducting film wherein the film has a width that is equal to or less than a critical width, the critical width being that width at which magnetic flux vortices are excluded from the superconducting film at a particular ambient magnetic field.

The present invention further comprises a high-$T_C$ superconducting quantum interference device (SQUID) for operation in an ambient magnetic field, the SQUID comprising at least one continuous strip of superconducting film, interrupted by at least one Josephson junction, the strip having a width that is less than or equal to a critical width, the critical width being that width at which magnetic flux vortices are excluded from the superconducting film at a particular magnetic field.

The present invention additionally comprises high-transition-temperature superconducting magnetometer for operation in a magnetic field, the magnetometer comprising, a) a high-$T_C$ SQUID having a body comprising, a plurality superconducting film strips, each film strip having a width that is equal to or less than a critical width, the critical width being that width at which flux noise is excluded from the superconducting film at a particular ambient magnetic field; b) a thin dielectric coating over the SQUID; and c) a flux transformer comprising a pickup coil and an input coil deposited on the dielectric coating and inductively coupled to the SQUID.

The present invention encompasses a large number of high-$T_C$ superconducting devices having low-level low-frequency noise-characteristics when operated in the presence of magnetic fields. For example one form of inventive voltmeter comprises an inventive high-$T_C$ SQUID, a structure for coupling a signal into the SQUID (such as a multiturn coil to inductively couple a signal, or a control line to directly couple a signal), and a voltage source coupled across the input structure. An inventive ammeter is similarly configured, but has a current source coupled across the input structure instead of a voltmeter.

The present invention further encompasses any of a large number of inventive superconducting devices fabricated so as to include high-$T_C$ superconducting films having a film width that is less than or equal to $w_C$, within normal fabrication constraints. That is the film with is narrow enough to exclude all magnetic flux vortices for a particular ambient magnetic field, B. A new class of high-$T_C$ superconducting devices will thus be able to be operated in the Earth's magnetic field of about 50 $\mu$T. The critical width was found to be about 6 micrometers ($\mu$m). However, to provide a safe margin for other factors that may allow entry of magnetic flux vortices, such as for example, irregularities in film fabrication, some devices were made having a 4 $\mu$m superconducting film width for operation in the Earth's magnetic field.

There are many instances in which high-$T_C$ superconducting devices would be useful for sensitive measurements if the noise problem at low frequencies could be cured. Some examples include, measurements of biological processes such as magneto-cardiograms or magneto-encephlagrams; basic neuro-signal research; geophysical surveying and prospecting, and nondestructive evaluation, among others.

III. SUMMARY DESCRIPTION OF THE DRAWINGS

FIG. 1 shows the prior art. The inset shows the geometry of a conventional SQUID, having a square washer loop interrupted by two Josephson junctions. The dashed line shows the grain boundary of the Josephson junctions.

IV. DETAILED DESCRIPTION OF THE INVENTION

Figure 1:
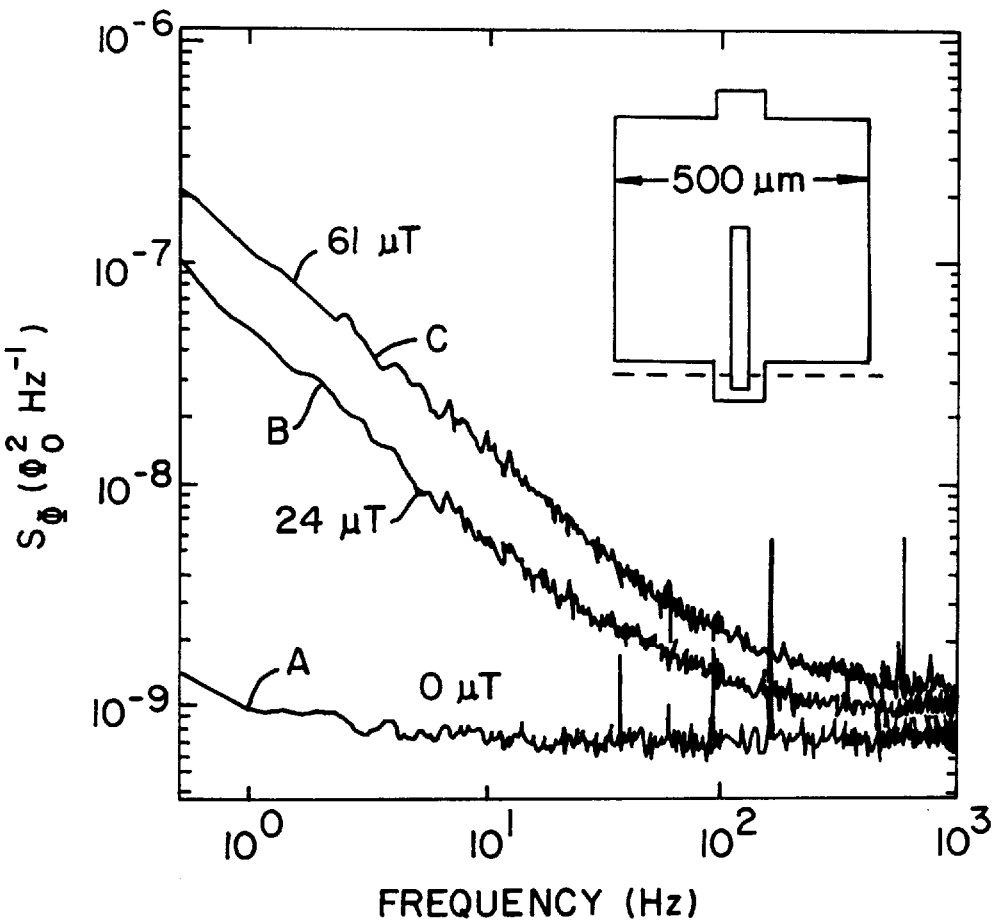

When a high-$T_C$ SQUID is cooled in a magnetic field, flux vortices develop in the superconductor. The movement of these vortices, due to thermal activation, results in excess noise, illustrated in FIG. 1.

The present invention comprises a high-transition-temperature (high-$T_C$)superconducting device for operation in an ambient magnetic field, the device comprising a superconducting film wherein the film has a width that is equal to or less than a critical width, the critical width being that width at which magnetic flux vortices are excluded from the superconducting film at a particular ambient magnetic field.

The present invention further comprises a high-$T_C$ superconducting quantum interference device (SQUID) for operation in an ambient magnetic field, the SQUID comprising at least one continuous strip of superconducting film, interrupted by at least one Josephson junction, the strip having a width that is less than or equal to a critical width, the critical width being that width at which magnetic flux vortices are excluded from the superconducting film at a particular magnetic field.

The present invention additionally comprises high-transition-temperature superconducting magnetometer for operation in a magnetic field, the magnetometer comprising, a) a high-$T_C$ SQUID having a body comprising, a plurality superconducting film strips, each film strip having a width that is equal to or less than a critical width, the critical width being that width at which flux noise is excluded from the superconducting film at a particular ambient magnetic field; b) a thin dielectric coating over the SQUID; and c) a flux transformer comprising a pickup coil and an input coil deposited on the dielectric coating and inductively coupled to the SQUID.

The present invention encompasses a large number of high-$T_C$ superconducting devices having low-level low-frequency noise-characteristics when operated in the presence of magnetic fields. For example one form of inventive voltmeter comprises an inventive high-$T_C$ SQUID, a structure for coupling a signal into the SQUID (such as a multiturn coil to inductively couple a signal, or a control line to directly couple a signal), and a voltage source coupled across the input structure. An inventive ammeter is similarly configured, but has a current source coupled across the input structure instead of a voltmeter.

The present invention further encompasses any of a large number of inventive superconducting devices fabricated so as to include high-$T_C$ superconducting films having a film width that is less than or equal to $w_C$, within normal fabrication constraints. That is the film with is narrow enough to exclude all magnetic flux vortices for a particular ambient magnetic field, B. A new class of high-$T_C$ superconducting devices will thus be able to be operated in the Earth's magnetic field of about 50 $\mu$T. The critical width was found to be about 6 micrometers ($\mu$m). However, to provide a safe margin for other factors that may allow entry of magnetic flux vortices, such as for example, irregularities in film fabrication, some devices were made having a 4 $\mu$m superconducting film width for operation in the Earth's magnetic field.

A conventional SQUID has a body width between about 150 $\mu$m and about several millimeters (mm). The SQUID body (frequently referred to as a washer) is basically a continuous loop of superconducting film that interrupted by at least one Josephson junction. The outer dimension of the SQUID washer has conventionally been made large to facilitate efficient coupling to the multiturn input coil. General instruction on the manufacture of conventional high $T_C$ SQUIDs can be found in *SQUID Sensors; Fundamentals, Fabrication, and Applications*, edited by Harold Weinstock, Kluwer Academic Press, Dardrecht, 1995. In conventionally fabricated SQUIDs like those just described, however, the threshold magnetic field for magnetic flux vortex entry is very low, and noise is a major practical problem for measurements taken at low frequencies in the Earth's magnetic field. FIG. 1 shows a conventionally designed SQUID having a washer, or body, that is about 500 micrometers wide. The graphs show how 1/f noise increases with increasing ambient magnetic field magnitude. Trace A shows noise vs. frequency for 0 microTesla ($\mu$T) ambient field. Trace B shows noise vs. frequency for a 24 $\mu$T ambient field. Trace C shows noise vs. frequency for a 61 $\mu$T ambient field.

The present invention comprises a modification in the pattern of a SQUID body, sometimes referred to as a washer. The width of the high-$T_C$ superconducting film strips that form the inventive SQUID body is restricted to less than or equal to a critical value to produce SQUIDs exhibiting reduced 1/f flux noise compared to SQUIDs produced using a conventional film width to form the body. The inventive films have low 1/f flux noise when used in a magnetic field, particularly at low frequencies. Practice of the present invention is not limited by the type of high-$T_C$ superconducting film used. For example, inventive films can be made using any of the large number of materials generally used to make high-$T_C$ super conducting devices (see, for example, Weinstock, supra), or others.

Figure 2:
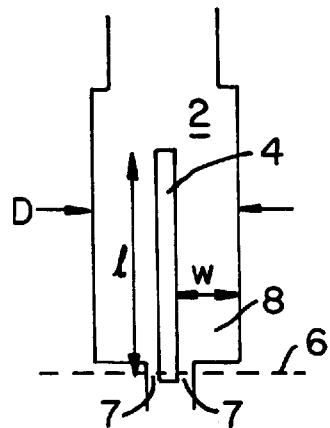
FIG. 2 shows the inventive SQUID having a body made from a single narrow loop of superconducting film.

Referring now to the drawings, FIG. 2 shows a film pattern for one embodiment of the inventive high-$T_C$ SQUIDs. The body of the SQUID 2 comprises a high-$T_C$ superconducting film strip 8 interrupted by two Josephson junctions 7. The loop encloses a small central slot 4. The dashed line 6 indicates a bicrystal boundary common to SQUID structure. Bicrystal Josephson junctions were used for these devices but any type of Josephson junction can be used in the inventive SQUID. A key difference in the inventive SQUID over conventional SQUIDs is the width, w, of the superconductor film strip 8 that forms the major portion of the SQUID body 2. The dimension, D, is the width of the entire device. The dimension 1 is the length of the central slot.

Figure 3:
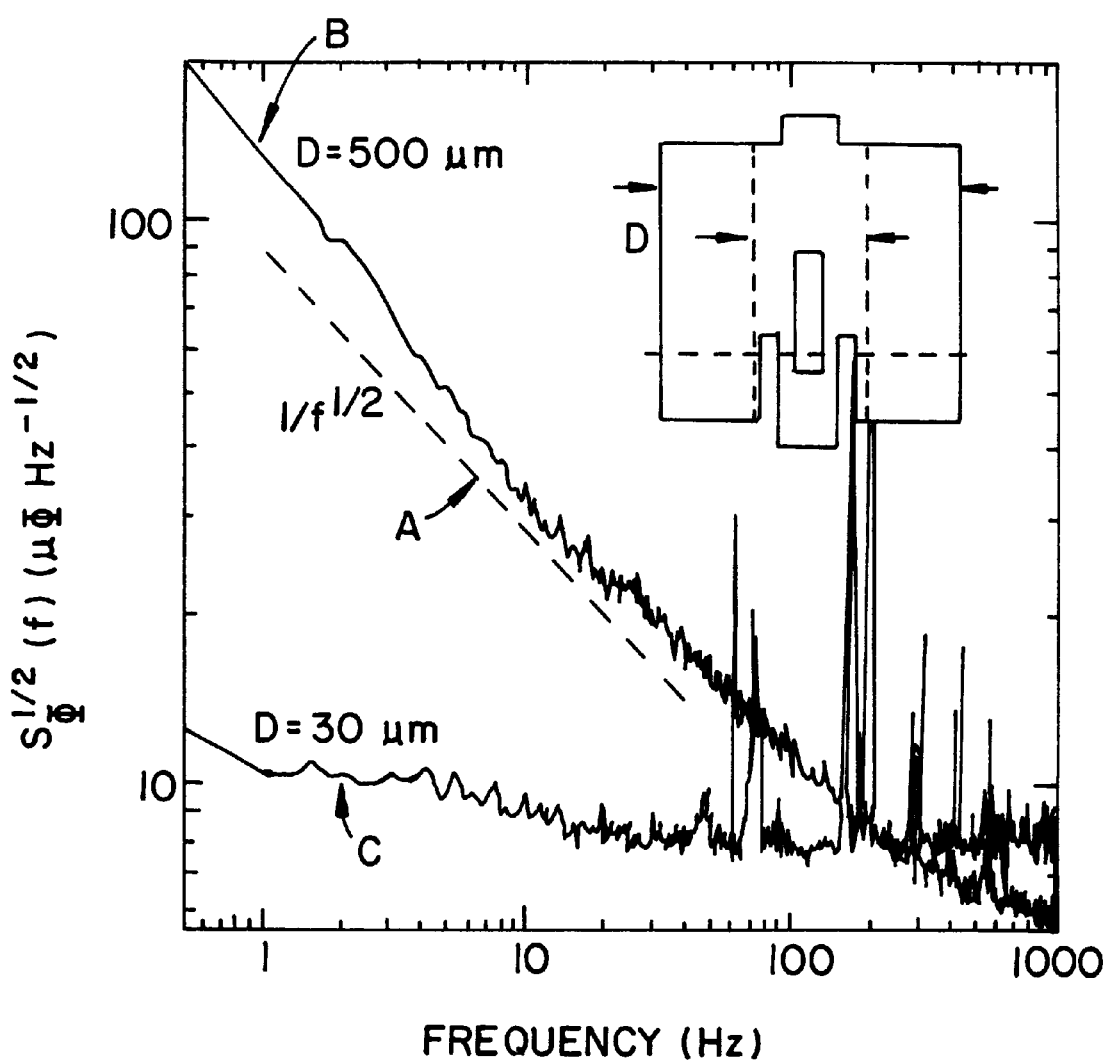
FIG. 3 shows the flux noise $S_\Phi^{1/2}$ (f) as a function of frequency in Hz for a) a conventional SQUID having a body width of 500 $\mu$m; and b) the inventive SQUID having a body width of 30 $\mu$m and a film width, w, of 13 $\mu$m. Both SQUIDs were cooled in a field of 24 $\mu$T.

FIG. 2 shows one pattern of SQUID body 2 formed from a single continuous film strip 8. In one embodiment, the film strip 8 that formed the body 2 was 13 micrometers ($\mu$m) wide. The length of the slot, 1, was about 100 $\mu$m, and the width of the slot was about 4 $\mu$m. This means that the overall width of the SQUID body, D, was about 30 $\mu$m. The fact that noise resulting from magnetic flux vortex movement was eliminated means that 13 $\mu$m wide SQUID loop was less than or equal to $w_C$, for the ambient B field in which cooling took place. The performance of this SQUID when cooled and operated in a 24 $\mu$T magnetic field is shown in FIG. 3.

It should be noted that due to variation in SQUID fabrication technology, the superconducting width of a film strip of a device may be smaller than the measured film strip width. That is, some of the film may not be superconducting. Table I shows the flux noise of the inventive narrow-body SQUID compared to SQUIDs having conventional body widths. As the strip of film forming the body of the SQUID is narrowed to less than $w_C$, it is thought that it becomes energetically unfavorable for magnetic flux vortices to enter the film.

TABLE I

| Device No. | D ($\mu$m) | l ($\mu$m) | L (pH) | Flux noise for B equal to: | | |
|---|---|---|---|---|---|---|
| | | | | 0 $\mu$T | 24 $\mu$T | 61 $\mu$T |
| 1 | 500 | 250 | 80 | 31 | 220 | 330 |
| 2 | 500 | 250 | 80 | 24 | 240 | 380 |
| 3 | 500 | 250 | 80 | 16 | 250 | 400 |
| 4 | 500 | 100 | 40 | 33 | 120 | — |
| 5 | 500 | 100 | 40 | 5 | 130 | 180 |
| 5* | 30 | 100 | 40 | 8 | 11 | 170 |

In a prediction made by J. R. Clem, (E. Dantsker et al., Appl Phys. Lett., 70(15):2037–9, 1997; private communication, J R Clem, Iowa State University Physics Dept., Ames, Iowa 50011), an infinitely perconducting film of width, w, cooled in the presence of a magnetic field, B, excludes magnetic flux vortices for fields below a threshold value of, $$B = (\pi \Phi_0)/(4w^2) \quad (1)$$

where $\Phi_0$ is defined as Planck's constant/2e, $= 2.07(10^{-15})$ Weber.

As the as high-$T_C$ superconducting film width decreases, a larger magnetic field is required to induce magnetic flux vortices to enter the film (E. Dantsker, High-Transition-Temperature SQUID Magnetometers and Practical Applications, Ph.D. Thesis, May 1997, University of California at Berkeley, incorporated herein by reference). The distance between vortices is a function of magnetic field, and it is thought that the critical width, $w_C$, is the width equal to the distance that would exist between magnetic flux vortices in a film large enough for them to enter for a given ambient magnetic field, B. It is thought that reducing the film width, w, to a value smaller than the vortex to vortex separation, $w_C$, makes it energetically unfavorable for vortices to penetrate the film. For a given film width, w, there is a threshold magnitude, $B_T$, for the ambient magnetic field where the noise begins to increase with increasing B. Similarly, for a given ambient magnetic field, one expects to see a threshold width, $w_C$, where the noise begins to increase as the film width increases.

In spite of this theory, it was not clear that narrowing SQUID film widths would decrease device noise. It could easily have been the case that narrow film widths contained fewer vortices to penetrate and exhibit thermally-driven flux vortex motion in the film, but it was also thought that any vortex that managed to enter the narrow film might have coupled more flux into the film with each movement thereby increasing the flux noise. Furthermore, no prediction was made regarding behavior of films in real devices such as high-$T_C$ SQUIDs.

Additionally, there remains some debate regarding the exact form of the equation, including for example, the $\pi/4$ factor. In practice it was found that the equation provides a helpful clue regarding a film width that might be narrow enough, but does not provide a strict prediction of the film width that will exclude magnetic flux vortices at a particular ambient magnetic field.

Solving for w in equation (1) gives, $$w_C = [(\pi \Phi_0)/(4B)]^{1/2} \quad (2)$$

Using this equation, one can predict that for B=100 $\mu$T, $w_C \cong 4$ $\mu$m; for B=50 $\mu$T, $w_C \cong 6$ $\mu$m; and for B=24 $\mu$T, $w_C \cong 8.2$ $\mu$m. In practice, if $w_C$ is made equal to about 4 $\mu$m, noise often began to increase at about 50 $\mu$T. The discrepancy between the predicted threshold of 100 $\mu$T and a frequently observed threshold of 50 $\mu$T ambient magnetic field was initially thought to be due to irregularities in the quality of the superconducting film. When special care was paid to fabrication methodology, the $B_T$ equal to or in some cases greater than, the theoretically predicted 100 $\mu$T was observed for w=4 $\mu$m in many devices. This highlights the point that Equation 2 provides only a starting point for making a low-noise high-$T_C$ SQUID in an ambient magnetic field.

Applying these principles to the practical construction of a SQUID device creates a dilemma however. As the SQUID body is made narrower, the SQUID's coupling efficiency to a multiturn input coil is reduced. Using the geometry shown in FIG. 2, a trade-off must be made between having a high threshold magnetic field for which magnetic flux vortices are excluded and having a high coupling efficiency to a multi-turn input coil.

FIG. 3 shows an example of data collected with an inventive SQUID, compared to a conventional SQUID having a large washer area. The inset, which is not drawn to scale, shows the SQUID configurations used, with two body width dimensions. The slot dimensions for both the inventive and the conventional SQUID was 100 $\mu$m by 4 $\mu$m. The horizontal dashed line indicates the grain boundary and the vertical dotted lines indicate the narrow body boundary of the inventive SQUID. That is, the superconducting film outside the vertical dotted lines was removed to make the inventive SQUID which had a body width D of 30 $\mu$m. The vertical solid lines represent a SQUID having a conventionally wide body, where D equals 500 $\mu$m. In the graph, trace A shows the calculated $1/f^{1/2}$ noise function and provides a reference. It should be noted that 1/f and $1/f^{1/2}$ are equally referred to as 1/f noise (The term "1/f noise" refers to the spectral density, S(f), scaling as 1/f; that is $S^{1/2}$ (f) scales as 1/f ½). Trace B shows the noise measured from a conventional SQUID having a body width of 500 $\mu$m. Trace C shows the noise measured in the inventive SQUID, having a body width of 30 $\mu$m. Both SQUIDs were cooled in a 24 $\mu$T field. It can be clearly seen that the noise is significantly reduced, by two orders of magnitude in power, in the SQUID having the inventive geometry. The spikes on the data traces, B, and C, are primarily due to 60 Hz ambient noise and its harmonics. The noise spectrum of the inventive device is essentially that of white noise for frequencies above 10 Hz and increases slowly at lower frequencies.

Figure 4:
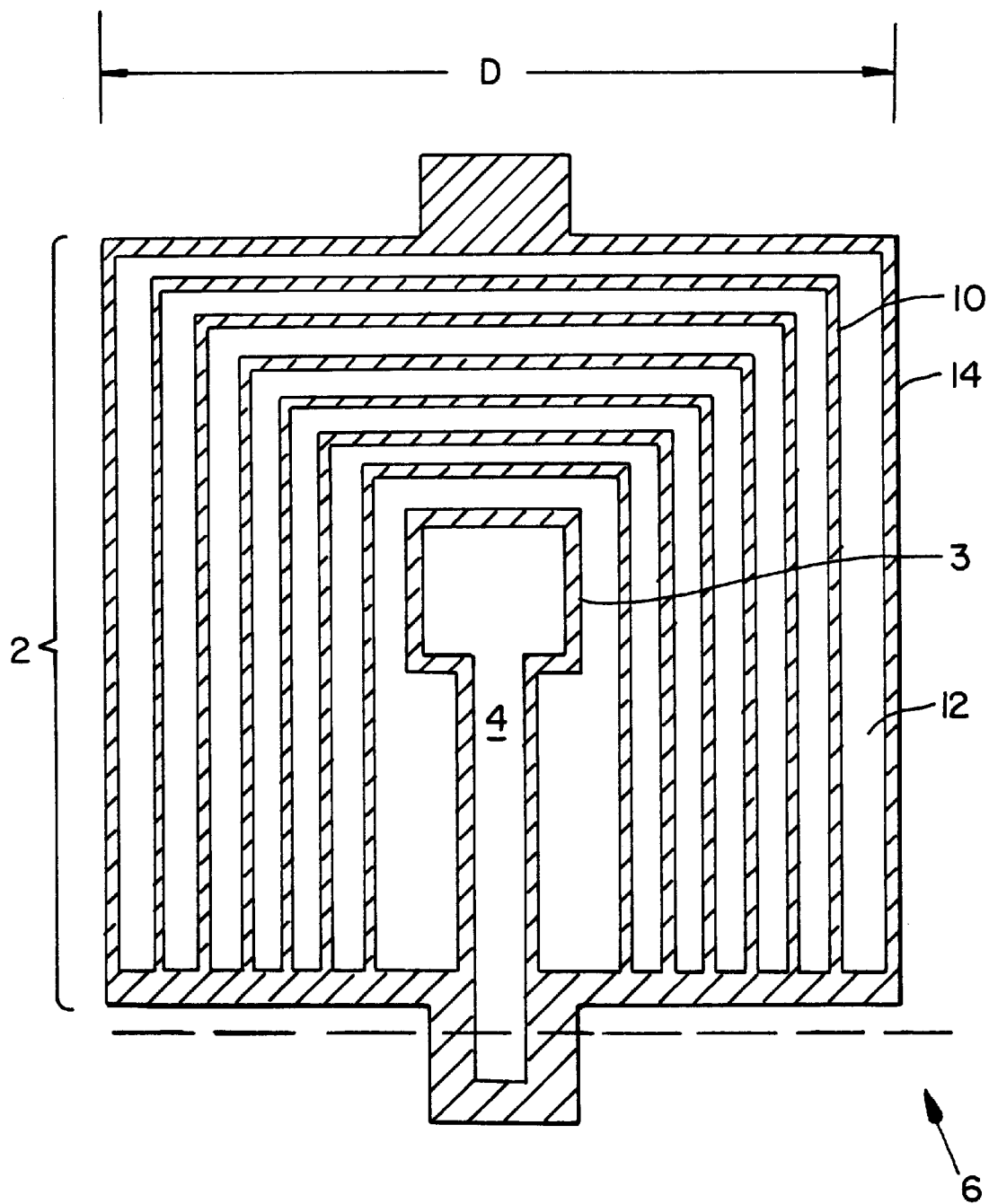
FIG. 4 shows a geometry of the inventive SQUID in which the film width, w, is kept narrow and the overall area covered by the SQUID is kept large so that low 1/f noise is combined with good inductive coupling to a multiturn input coil.

FIG. 4 shows a preferred body pattern of an inventive SQUID, wherein the film width 10 is minimized and arranged in a pattern to create a conventional SQUID body width, D. This pattern has a high inductive coupling efficiency to a multiturn input coil. The SQUID body pattern depicted in FIG. 4 can be thought of as a conventionally wide washer that is interpenetrated by a series of slots 12. However, the key to the inventive SQUID body design lies in keeping superconducting film strip widths equal to or less than $W_C$. Using the pattern shown in FIG. 4, the inductive coupling was almost as efficient as with a conventional SQUID geometry and the noise arising from cooling the device in a static magnetic field was essentially eliminated. FIG. 4 shows a geometry of rectilinear film strips in which the film width is minimized throughout the device. The invention does not reside specific geometric pattern of superconducting film strips forming embedded squares or rectangles. It is easy to think of other configurations, such as circles, ovals, crosshatching, or other patterns that achieve the inventive design requirement of minimizing superconducting film strip width 10 to a value equal to or less than $w_C$ throughout the device. The presence of a large number of strips is not essential to the inventive device as long as there is a continuous loop to complete the circuit to the Josephson junctions. Optionally, at least one additional film strip, connected in parallel to the first strip, and formed to delineate an outside dimension of a SQUID body in order to achieve good inductive coupling is added to the basic SQUID circuit. That is, in FIG. 4, inner loop 3 is sufficient to configure the inventive device. More optimally, a SQUID having a body comprising an inner loop 3 in combination with outer loop 14, wherein the film strip width is equal to or less than $w_C$, will exclude magnetic flux vortices for magnetic fields up to the associated $B_T$ and exhibit inductive coupling characteristics associated with a SQUID body dimension approximately equal to the outer strip, 14.

Even more optimally, a plurality of film strips are used in the inventive SQUID body pattern, that are configured to yield any required operation parameters while exhibiting low noise in an ambient magnetic field and high inductive coupling to a multiturn input coil.

The inventive high-$T_C$ superconducting device optimally has a) no excess noise in ambient magnetic fields; and b) efficient coupling to a planar multiturn input coil. The conventional square washer shown in the inset of FIG. 1 fulfills the second function but not the first, as the graph in FIG. 1 shows. Using a SQUID body formed from a plurality of superconducting film strips having widths$\leq w_C$, and electrically connected in parallel, FIG. 4 and FIGS. 7b and 7c show designs that fulfill both desired functions. The inventive principle is to keep all film strip widths equal to or less than $w_C$. For example, in the photomasks shown, a w=4 $\mu$m was chosen, for which the predicted vortex entry field using equation 2, is 100 $\mu$T.

In FIG. 4, the washer contains 7 slots 12 that penetrate a portion of the SQUID film that is conventionally solid, leaving a set of parallel film strips 10, surrounding a central slot 4. In FIG. 7b, the photomask contains 8 slots. Each slot is 8 $\mu$m wide, and separates 9 YBCO film strips, each 4 $\mu$m wide. Another way to think of this structure is as 8 pickup loops of a directly coupled magnetometer connected in parallel to a single SQUID. FIG. 7c shows a second design in which 248 holes, each 8 $\mu$m×8 $\mu$m divide the square washer into a grid of 4 $\mu$m wide lines. In FIGS. 7d and 7e, the number of slots and holes, respectively, were reduced to 5 slots or 125 holes, leaving a superconducting film strip that was about 40 $\mu$m wide around three sides of those devices. This was done to determine whether a wide film strip width located some distance away from the central SQUID slot 4 would couple significant amounts of 1/f noise. All five devices had outer dimensions of 186 $\mu$m×204 $\mu$m. The central slot 4 was 100 $\mu$m long and 4 $\mu$m wide.

Figure 7:
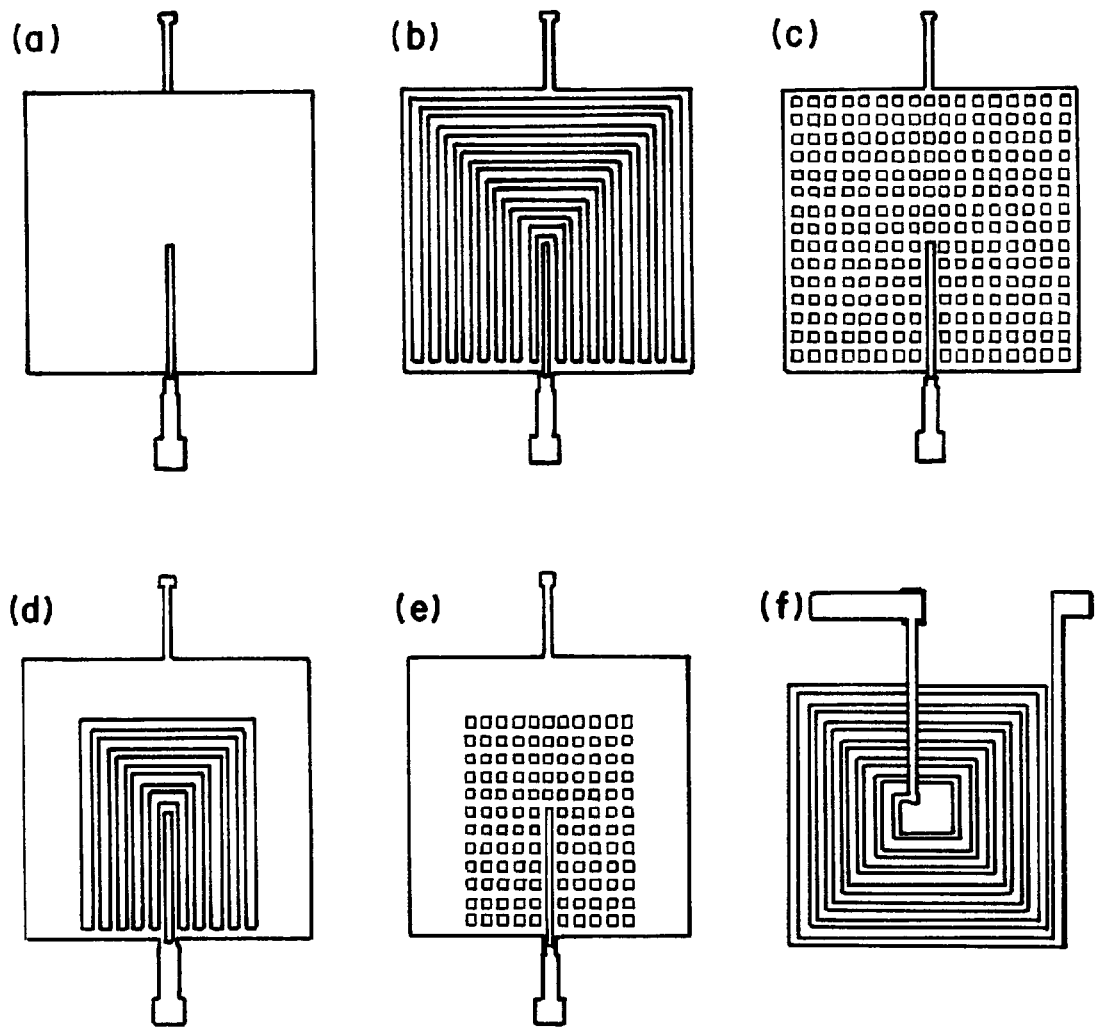
FIG. 7 shows patterns of the photomasks used to make, (a) a conventional high-$T_C$ SQUID having a body made from a single loop of superconducting film, and SQUIDs having a body interpenetrated by: (b) eight slots, (c) 248 holes, (d) five slots, and (e) 125 holes. The outer dimensions of each device are 186 $\mu$m×204 $\mu$m. (f) shows seven-turn coil that was coupled to SQUID designs (a) to (c).

The inventive device shown in FIGS. 4 and 7 will be discussed in greater detail in the examples below.

A number of experiments were conducted to examine the behavior of inventive high-$T_C$ superconducting devices when operated in a static controlled magnetic field. In some circumstances inventive devices were compared to a conventional device.

To investigate the effects of cooling and operating a device in an ambient static magnetic field while excluding the influence of other noise sources, the following procedures were used.

A vertical attachment to a conventional noise probe was used. It is illustrated in FIG. 11.1 of the Ph.D. thesis of Eugene Dantsker, (supra). The SQUID chip was mounted on top of a G-10 fiberglass block positioned in the approximate center of a solenoid having about 1500 turns of copper wire wrapped in a single layer about a plastic tube. The solenoid provided a static magnetic filed (perpendicular to the chip) at 16.4 $\mu$T/mA, supplied by a lead-acid battery. To screen against the earth's magnetic field and its fluctuations, the solenoid was placed in a cryoperm shield with one endcap and the dewar was surrounded by a triple mu-metal shield. For some measurements a cylindrical shield of YBCO on a YSZ tube was placed inside the solenoid and cooled with the SQUID to stabilize the field against drift. This shield is described thoroughly by T. W. Button et al., *The processing and properties of high-$T_C$ thick films*, IEEE Trans. Mag., 27:1434, 1991. The shield was discarded in later experiments when it was found that it actually generated excess noise (particularly in fields above 50 $\mu$T) and that the field could be kept from drifting if the battery was first allowed to partially discharge.

In typical measurements a current was supplied to the solenoid, then the entire assembly was lowered into liquid nitrogen. After characterizing the SQUID, the current was re-adjusted to the next value to create a new ambient magnetic field, the probe was lifted above the level of the nitrogen and the device was re-lowered, so that the SQUID was re-cooled in the new field. In some experiments the SQUID chip was hermetically sealed in a package equipped with a heater. That allowed the temperature of the SQUID to be raised and lowered in about 5 minutes. Since a complete characterization of the field dependence of $S_\Phi(f)$ of a SQUID usually took about one week, three SQUIDs on a chip were typically connected simultaneously. Each was measured in turn before changing B. The SQUID was operated in a 100 kHz flux-locked loop. In order to specifically examine the excess 1/f flux noise, all SQUIDs described herein were operated using a 2 kHz bias reversal scheme. In contrast with the work by Miklich, et al., supra, no change was observed in the critical current for cooling fields up to 60 $\mu$T. This is probably because most of the junctions were 1 $\mu$m wide and therefore had a smaller flux capture area.

EXAMPLE 1
Threshold Magnetic Field as a Function of Film Width in SQUIDs Having Narrow Bodies Comprising a Single Continuous Loop.

Figure 5:
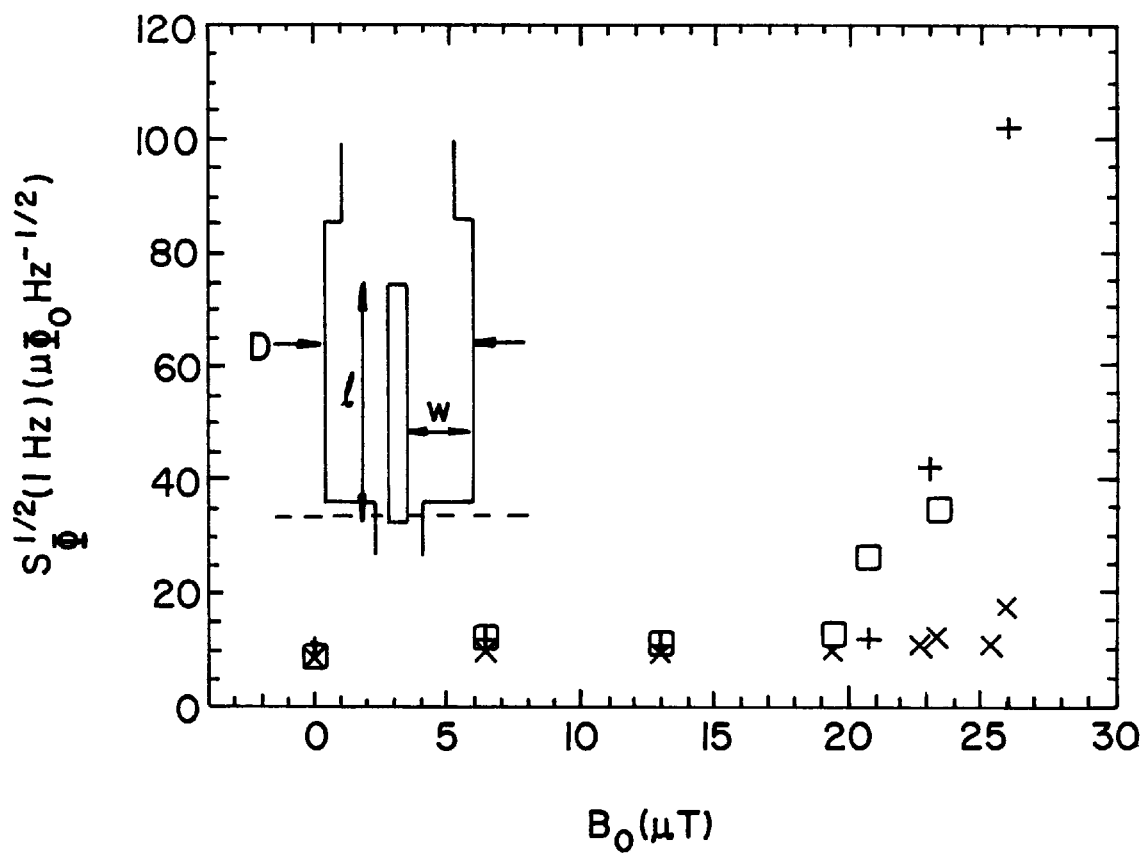
FIG. 5 shows the flux noise $S_\Phi^{1/2}$ (f) as a function of the ambient magnetic field magnitude, B, during the SQUID cooling process for SQUIDs having a body made from a single loop of superconducting film and w of 8 $\mu$m and 13 $\mu$m. The inset shows SQUID geometries.

Nine SQUIDs configured like the one shown in FIG. 5 were investigated on a bicrystal. Seven of the nine showed the behavior displayed in FIG. 5. The other two exhibited a rather different behavior in which flux noise increased linearly with B. Presumably vortices, were not excluded from these SQUIDs, even when only very small ambient magnetic fields were present during cooling. It could be that variation in film quality, particularly at the edges, contributes to the differences in behavior.

FIG. 5 shows the flux noise as a function of magnetic field for inventive SQUIDs having different body widths, D, and superconducting film widths, w. Two inventive SQUIDs having a body width of 30 $\mu$m and w of 13 $\mu$m are designated with the symbols + and □. Flux noise begins to increase at a threshold ambient magnetic field, B, equal to about 20 $\mu$T. A third inventive device, having a smaller body width of 20 $\mu$m, corresponding to w equal to 8 $\mu$m, does not show a significant increase in flux noise up to B equal to about 26 $\mu$T. The length of the 4 $\mu$m wide slot was adjusted to keep the estimated inductance, L, of each SQUID loop at either 20 or 40 pico-Henrys (pH).

Table II, below, summarizes parameters measured on seven inventive devices. Devices numbered 6–9 were bare SQUIDs. Devices numbered 10–12 were directly coupled magnetometers, and are discussed in example 3 below. The critical current, $I_0$, and resistance, R, are expressed per junction. $B_T$ is the threshold ambient magnetic field for which noise begins to increase. It can be seen that $B_T$ increases as w decreases. Using equation 1, above, $B_T$ was calculated to be 10 $\mu$T for w=13 $\mu$m and 26 $\mu$T for w=8 $\mu$m. The second calculated value agrees well with the measured value. In this case inverse relationship between w and $B_T$ is accurately predicted by equation 1. The importance of film quality in achieving results predicted by equations 1 and 2 is discussed further below.

TABLE II

| Device No. | D ($\mu$m) | w ($\mu$m) | l ($\mu$m) | $I_0$ ($\mu$A) | R ($\Omega$) | L (Ph) | $B_T$ ($\mu$T) |
|---|---|---|---|---|---|---|---|
| 6 | 20 | 8 | 48 | 65 | 1.8 | 40 | 26 |
| 7 | 30 | 13 | 55 | 88 | 1.1 | 40 | 20 |
| 8 | 30 | 13 | 55 | 74 | 1.4 | 40 | 19 |
| 9 | 20 | 8 | 24 | 130 | 1.2 | 20 | N/A |
| 10 | 30 | 13 | 55 | 62 | 1.8 | 40 | 20 |
| 11 | 12 | 4 | 40 | 54 | 2.0 | 40 | 33 |
| 12 | 12 | 4 | 40 | 45 | 2.2 | 40 | 33 |

EXAMPLE 2
Noise Spectra as a Function of Ambient Magnetic Field During Device Cooling in Inventive Narrow Body SOUIDs Device 8 (w=13 $\mu$m) was cooled in the presence of a magnetic field and the flux noise was measured as a function of frequency. The measurements were repeated for three different ambient magnetic fields, 0 $\mu$T, 19.5 $\mu$T, and 23.4 $\mu$T. The four resulting curves were similar to those shown in FIG. 3. For B=0, the curve was essentially flat at the intrinsic thermal noise level.

When the device was cooled in a field of B=19.5 $\mu$T, the noise above about 5 Hz was indistinguishable from the flat zero-field response. Below about 5 Hz the noise increased slightly indicating onset of flux vortex entry.

When the device was cooled in a field of B=23.4 $\mu$T, the flux noise, at 1 Hz, increased by about a factor of 3 over the zero-field value. The power spectrum below about 200 Hz scales approximately as $1/f^{0.4}$; a significantly more shallow slope than typically seen in conventional high-$T_C$ SQUIDs.

EXAMPLE 3
Directly Coupled Magnetometers

On a separate bicrystal, ten small directly coupled magnetometers were fabricated. The magnetometers were comprised of a SQUID coupled to a pickup loop made of a 4 $\mu$m wide film strip laid out in a 1.8 mm by 3.8 mm rectangle. The SQUIDs were made having a body width, D, between about 12 $\mu$m and about 30 $\mu$m. The effective areas of these magnetometers were comparable to those of conventional large-washer SQUIDs having an outside diameter of about 500 $\mu$m.

Figure 6:
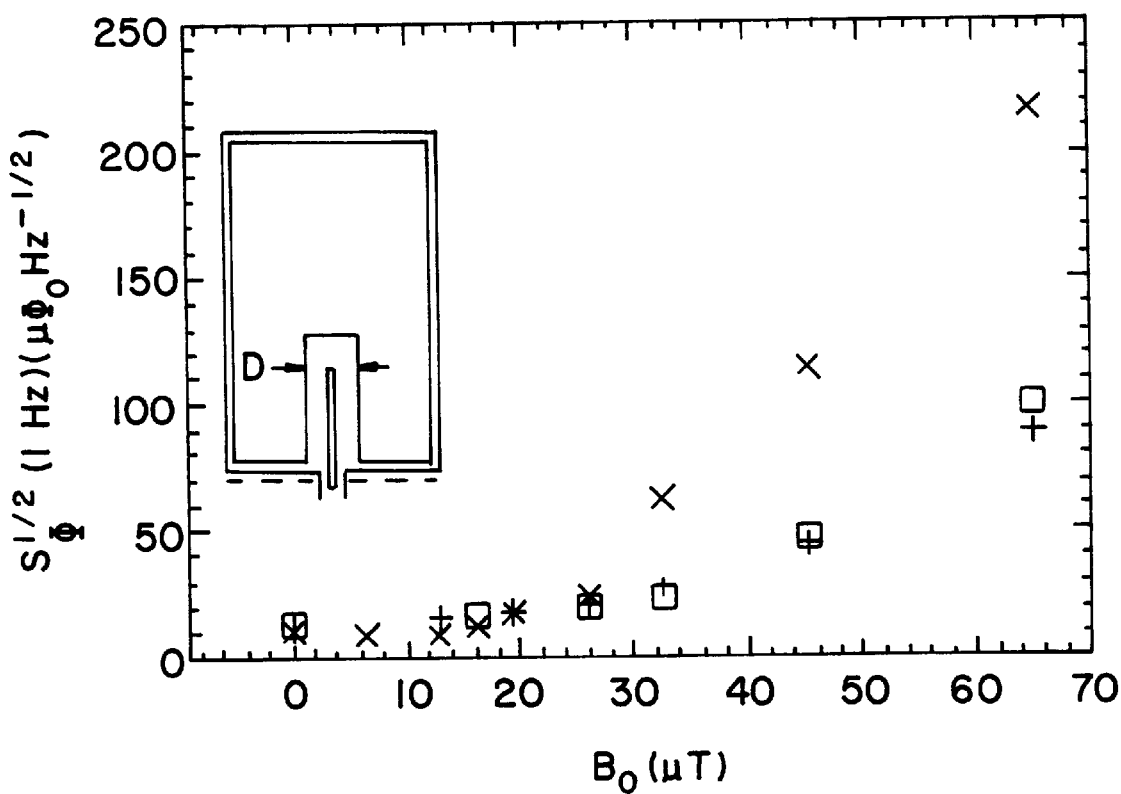
FIG. 6 shows the flux noise $S_\Phi^{1/2}$ (f) as a function of magnetic field magnitude, B, during the cooling process for directly coupled magnetometers made using the inventive SQUIDs. Data is shown for magnetometers made with SQUIDs having w of 13 $\mu$m and 4 $\mu$m.

In FIG. 6, the geometry of devices 10–12 are shown schematically in the inset. The graph shows the flux noise on the ordinate and the magnetic field (in $\mu$T) that was applied during cooling of the magnetometer on the abscissa. Measurements obtained from device 10 are denoted with the symbol X, device 11 with the symbol +, and device 12 with the symbol □.

The graph in FIG. 6 shows flux noise vs. B for these devices. For D=30 μm (w=13 μm), the noise increases at about 20 μT (as it did for the similarly-configured device discussed in example 1), while for the two devices with D=12 μm (w=4 μm), the threshold is about 33 μT. For a film width of 4 μm, Equation 1 predicts a threshold field of $B_T$=100 μT. The discrepancy between the prediction and the observed value was found to be due to film quality variation at the edges. When film fabrication was controlled to provide sharper film edges, the threshold field of 100 μT was observed (see example 6). The increase of magnetic flux vortices with B above the threshold is indicative of increasing numbers of vortices penetrating the SQUID body under the influence of fields stronger than $B_T$. In that case, however, one expects the noise power to scale as B. The quadratic scaling seen here is, as yet, difficult to explain but it may be only the onset of vortex penetration that depends on the film width.

EXAMPLE 4
SQUIDs Having Bodies Comprising a Plurality of Narrow Film Strips Electrically Connected in Parallel Twelve SQUIDs, 2 to 3 of each of the types illustrated in FIG. 7a to 7e, were made paying special attention to fabrication details important to film quality, particularly at the edges. For convenience, the SQUIDs illustrated in FIGS. 4 and 7b–7e are referred to as SQUIDs of the type that have slots or holes. They were patterned in a 150 nm-thick film of YBCO on a 10 mm×10 mm STO bicrystal using photolithography and argon ion milling at normal incidence without substrate rotation. Exposure and development parameters for the photoresist were optimized using standard techniques until the edges looked very smooth as seen under a high-power optical microscope. The edges of the patterned YBCO films looked more smooth than they had for the single loop devices listed in Tables I and II and described in the examples above. Presumably, the photomask, and thus the YBCO edges, were very close to vertical. The bridges across the bicrystal boundary forming the junctions were approximately 1 μm wide. The critical current, $I_0$, and resistance, Ω, per junction are listed in Table III for each of seven SQUIDs, having either slots or holes, that were investigated. $A_{eff}$ is the effective area of the device and $M_i$ is the mutual inductance to a 7-turn input coil (shown in FIG. 7f). In the column under the heading, SQUID Type, letters in parentheses indicate the geometry of that particular device as shown in FIGS. 7a–7f.

TABLE III

| Device & symbol | SQUID Type | $I_0$ (μA) | R (Ω) | $A_{eff}$ ($10^{-3}$ mm$^{-2}$) | $M_i$ (pH) |
| --- | --- | --- | --- | --- | --- |
| 1. ◆ | 1 conventional (a) | 19 | 3.8 | 5.01 | 148 |
| 2. X | 8 slots (b) | 40 | 2.0 | 5.45 | 125 |
| 3. + | 8 slots (b) | 35 | 2.0 | 5.58 | — |
| 4. ▽ | 248 holes (c) | 18 | 2.6 | 5.95 | 129 |
| 5. ○ | 5 slots (d) | 21 | 2.0 | 6.81 | — |
| 6. ◇ | 125 holes (e) | 12 | 3.4 | 6.18 | — |
| 7. □ | 125 holes (e) | 60 | 2.2 | 6.67 | — |

Note:
when multiple slots or holes are indicated, the number does not include the center slot.

Figure 8:
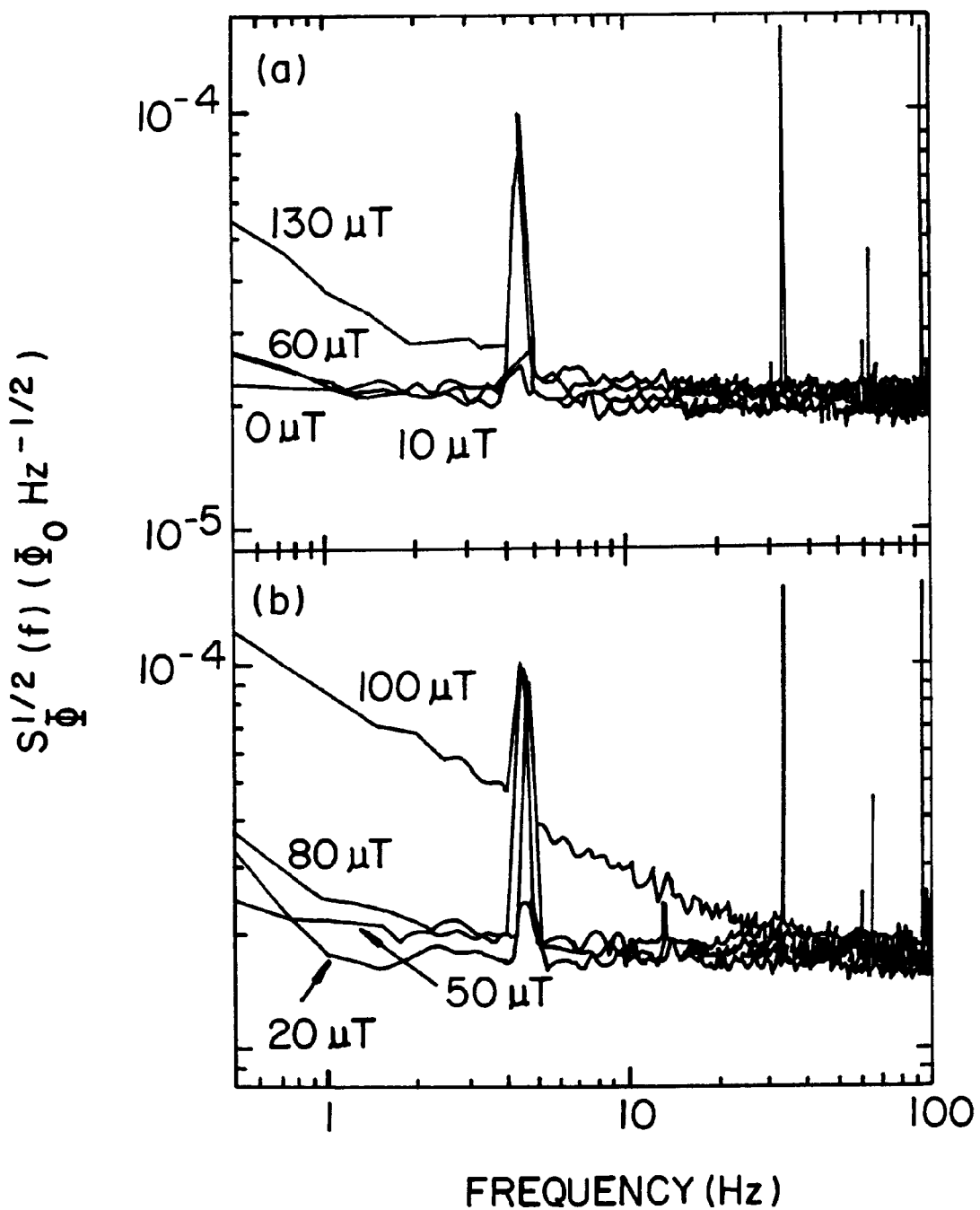
FIG. 8A shows the flux noise vs. frequency for four ambient B fields for the inventive SQUID having a body interpenetrated with 8 slots.
FIG. 8B shows the flux noise vs. frequency for four ambient B fields for the inventive SQUID having a body interpenetrated with 248 holes.

EXAMPLE 5
Flux Noise as a Function of Frequency in SQUIDs Having Bodies Comprising a Plurality of Narrow Film Strips Electrically Connected in Parallel FIG. 8A shows the root mean square (rms) flux noise for SQUIDs with 8 slots and FIG. 8B shows the rms flux noise for SQUIDs with 248 holes. These are the geometries shown in FIGS. 7b and 7c, respectively. Each was cooled in four different magnetic fields.

FIG. 8A shows that at 1 Hz, there is no increase in the noise for cooling the device in the presence of a magnetic field up to 60 μT. At 130 μT, however, the noise at 1 Hz has increased by a factor of 2. FIG. 8B shows that the threshold magnetic field value is between 80 μT and 100 μT.

In both cases the threshold ambient field for which noise appears at 1 Hz is close to the calculated value, for w=4 μm, of $B_T$ =100 μT. The presence of film cross-patterns at the corners of the holes, where the diagonal is greater than 4 μm, may account for what appears to be a slightly lower $B_T$ in the case of hole-patterning in contrast to slot-patterning.

Figure 9:
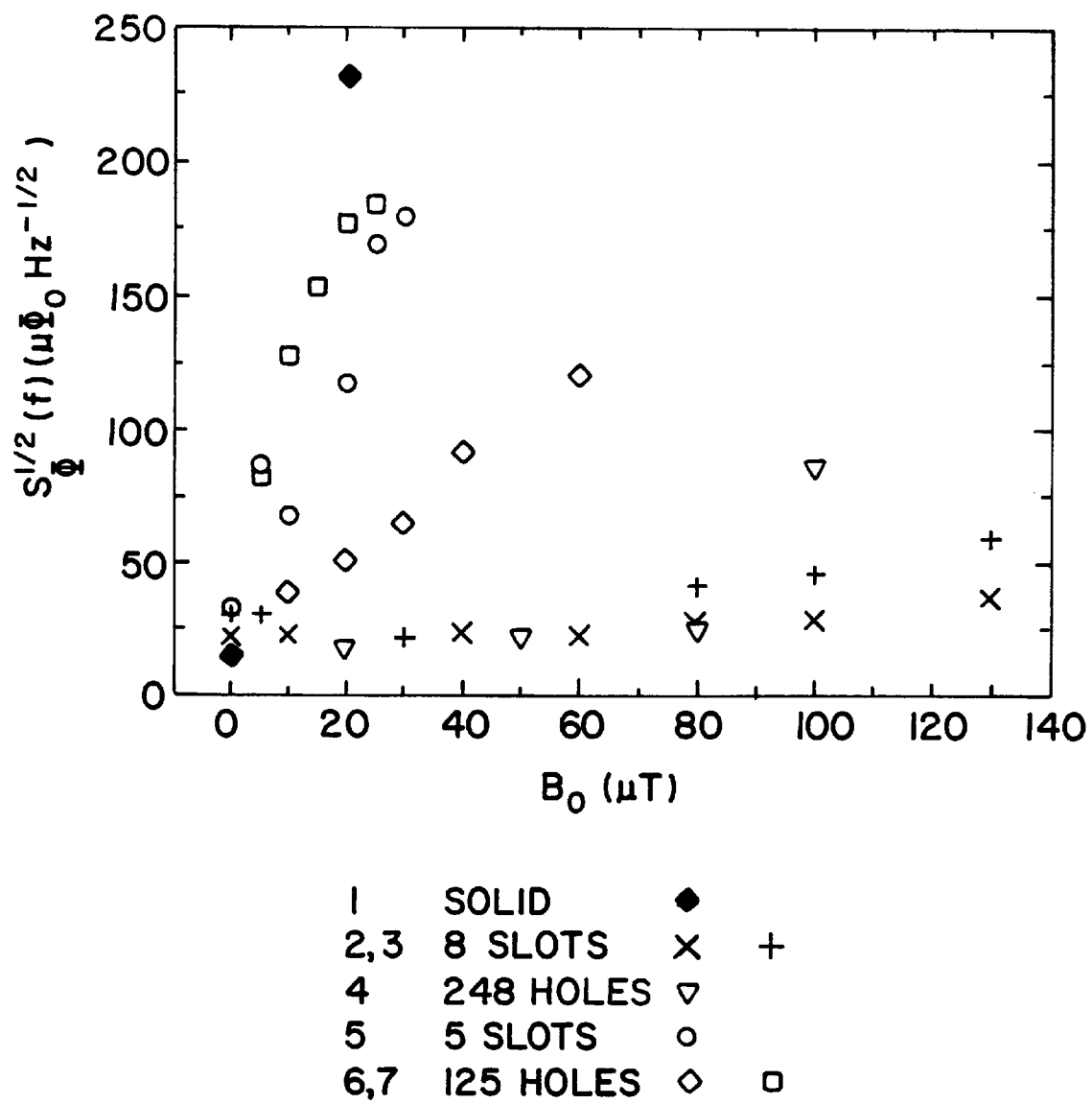
FIG. 9 shows the flux noise at 1 Hz vs. ambient B field during cooling for one SQUID having a conventionally-patterned body and six different inventive SQUIDs having bodies made using inventive patterns.

EXAMPLE 6
Flux Noise at 1 Hz as a Function of Magnetic Field in SQUIDs Having Bodies Comprising a Plurality of High-$T_C$ Superconducting Film Strips FIG. 9 shows the flux noise as a function of the ambient magnetic field during device cooling for the seven SQUIDs listed in Table III.

The solid diamond shows the results for a conventional wide body SQUID. It clearly shows the highest flux noise for the lowest non-zero ambient magnetic field, B.

Devices 5, 6, and 7, all of which had a 40 μm film strip width around the edge of the device, exhibited the next highest noise level for a given ambient B field. This shows that a wide film strip located some distance away from the central SQUID slot 4 does couple a significant amount of 1/f noise, though less than a conventional device.

Devices 2, 3, and 4 were virtually independent of the cooling field, B, up to a threshold value. The best SQUIDS, devices 2 and 3, were made having uniform film strip widths of about 4 μm, subject to the normal variations due to fabrication technology and due to turns, corners, and junctions in the film pattern. The separation, or slots, between the film strips were about 8 μm wide. These devices exhibited no significant increase in flux noise for values of B up to above 100 μT, the calculated threshold from equation 1.

Device 4, having 248 holes, again showed a threshold between about 80 μT and about 100 μT, a slightly lower value than the slot geometry yielded. This result is consistent with the fact that the largest film width of the superconducting film, at each intersection of two lines, is $(4^2+4^2)^{1/2}$ $=4(2)^{1/2}$ μm. For devices 2 and 3, having long slots, there are only a small number of such wider regions.

In summary, SQUIDs in which the film strip width was essentially kept at a constant width equal to or less than $w_C$, such as in the geometry wherein the SQUID body was configured from a plurality of film strips, showed no significant increase in the 1/f noise when cooled in magnetic fields up to a threshold magnitude. The threshold value of B appears approximately consistent with equation 1, but is best determined on an experimental basis. Equation 1 is a useful guide to provide a starting experimental value for any given device.

It was additionally shown that the presence of a superconducting strip having a width greater than $w_C$ and located some distance away from the Josephson junctions did not add so much magnetic flux vortices that the benefit of keeping the superconducting film width equal to or less than $w_C$ near the Josephson junction was not entirely lost.

EXAMPLE 7
Coupling Efficiency Between Inventive Superconducting SQUIDs and an Input Coil In the case of a SQUID having only one small central slot, the SQUID washer (or superconducting film) acts as a superconducting ground plane for an inductively coupled multiturn input coil. Making the washer large so that the number of input turns can be maximized in the input coil, results in high coupling efficiency. $M_i$ is defined as the inductance between the SQUID washer and the multiturn input coil.

The effect on the SQUID effective area and $M_i$ of configuring the washer with a plurality of superconducting film strips having narrow widths that were kept essentially constant, was measured. The effective area was measured using a solenoid to determine the amount of magnetic field required to produce one flux quantum in the SQUID. The results are summarized in Table III. In all cases the use of a plurality of film strips, connected in parallel, increased the effective area of the SQUID over the value for a conventional SQUID having the same outer dimensions. An analysis of greater detail can be found in E. Dantsker's Ph.D. Thesis (supra).

The mutual inductance $M_i$ between each of three SQUIDs (FIGS. 7a–7c) and a 7-turn input coil, illustrated in FIG. 7(f), is also summarized in Table III. The coil was fabricated on a glass substrate from thin films of Cu—Au separated by a layer of SiO and involved two vias and a crossover. The coil was coupled to each SQUID in a flip-chip arrangement with a 3 μm-thick Mylar foil separating the two chips. The mutual inductance was measured by passing a small current through the coil. As seen in Table III, using a plurality of film strips electrically connected in parallel and geometrically configured either as parallel strips (FIG. 7b) or cross-patterned strips (FIG. 7c), in devices 2 and 4 respectively, only slightly reduced the value of $M_i$ compared with the conventional SQUID having the same outer dimensions (FIG. 7a and device 1, Table III). Thus a flux transformer is expected to couple to a SQUID having a plurality of film strips, electrically connected in parallel, nearly as efficiently as to a conventional SQUID.

EXAMPLE 8
Low-Noise High-$T_C$ Superconducting Magnetometers

The total noise contribution of a flux transformer having a multiturn input coil coupled to an inventive low-noise, high-$T_C$ SQUID was analyzed. There are two sources of flux noise: a) direct noise, in which the motion of magnetic flux vortices in the input coil couples flux noise directly into the SQUID, and b) indirect noise, in which magnetic vortex motion in both the input coil and the pickup loop generates a noise current in the flux transformer and thus a noise flux in the SQUID. The direct noise can be eliminated by making the film strip width of the input coil sufficiently narrow, say 4 microns or less. However, it is desirable to increase the width of the pickup loop to 1 mm or more in order to keep its inductance low and thereby increase the sensitivity of the magnetometer. The pickup loop would then be interpenetrated by vortices. It can, however, be shown that the contribution of these vortices to the 1/f noise in the SQUID is rather small.

Consider a flux transformer with a pickup look of width $w_P$, perimeter $l_P$ and inductance $L_P$, and an n-turn input coil with inductance $L_i$ inductively coupled to the SQUID inductance L via mutual inductance $M_i$. Assuming $L_P=L_i$ and ideal coupling between the SQUID and the input coil so that $L_i=n^2 L$ and $M_i=nL$, it is straightforward to show that the spectral density of the flux noise coupled into the SQUID due to flux vortex motion in the pickup loop is, $$S_\Phi(f) \approx S^U_\Phi(f)\, (l_P/w_P)\, (1/16n^2)$$

where $S^U_\Phi(f)$ is the spectral density of a solid superconducting film. Taking as typical the values $S^U_\Phi(1\,\text{Hz}) \leq 10^{-9}\Phi^2_0\text{Hz}^{-1}$, $l_P=40$ mm, $w_P=1$ mm and n=16, it was found that $S_\Phi(1\,\text{Hz}) \leq 10^{-11}\Phi^2_0\text{Hz}^{-1}$. This corresponds to a flux noise of about $3\,\mu\Phi_0\text{Hz}^{-\frac{1}{2}}$, smaller than the lowest noise that was observed in washer SQUIDs. The conclusion is that vortices in the flux transformer should not add significantly to the noise of the magnetometer cooled in a static magnetic field.

EXAMPLE 9
Superconducting Digital Electronics

Digital electronics based on superconductor technology offers a key advantage over semiconductor technologies in terms of much higher speed and lower power dissipation. Broadly speaking, superconducting digital circuitry can be divided into "voltage-state" logic such as Modified Variable Threshold Logic (MVTL) and "flux-state" logic such as Rapid Single Flux Quantum Logic (RSFQ). (Ref. K. Likharev, Dynamics of Josephson Junctions and Circuits, Gordon and Breach Science Publishers, 1986.) The latter relies on controlled manipulation of individual flux vortices. Components of superconducting digital electronics include analog-to-digital converters, shift registers, clocks, memory, and processors, as well as a variety of other components analogous to the semiconductor counterparts. Most of these are based on the SQUID.

Superconducting digital electronics cannot function in the ambient magnetic field of the earth. Flux vortices penetrate the superconducting films of the circuits and move randomly under thermal activation generating bit errors. Conventionally one must reduce the ambient static magnetic field to below 100 nT through the use of multiple high-permeability shields. The necessity for these shields limits the utility of the electronics, particularly in space applications where the extra weight of the shields is a serious hindrance.

By using the inventive devices with film strip widths less than or equal to the critical width in a given ambient field, it becomes possible to operate high-$T_C$ superconducting digital electronics in the ambient magnetic field without trapping flux vortices in the films of the SQUIDs.

EXAMPLE 10
Low Capacitance Coupling Design

One additional advantage associated with the SQUID configurations shown in FIGS. 4 and 7b is the ability to reduce parasitic capacitance between a multitun input coil and the SQUID body. Conventionally the input coil is separated from the SQUID washer by a thin layer of dielectric material, which creates a capacitance between the coil and the washer. This capacitance, referred to as parasitic capacitance, depends on the thickness of the dielectric film as well as the size, shape and number of turns in the input coil. The capacitance combined with the inductance of the input coil creates resonances that affect the structure of the current-voltage characteristic of the SQUIDs, and increases the white noise. A large capacitance of about 10 picofarads (pf) typically limits the frequency response of the SQUID magnetometer to below about 200 MHZ.

Figure 10:
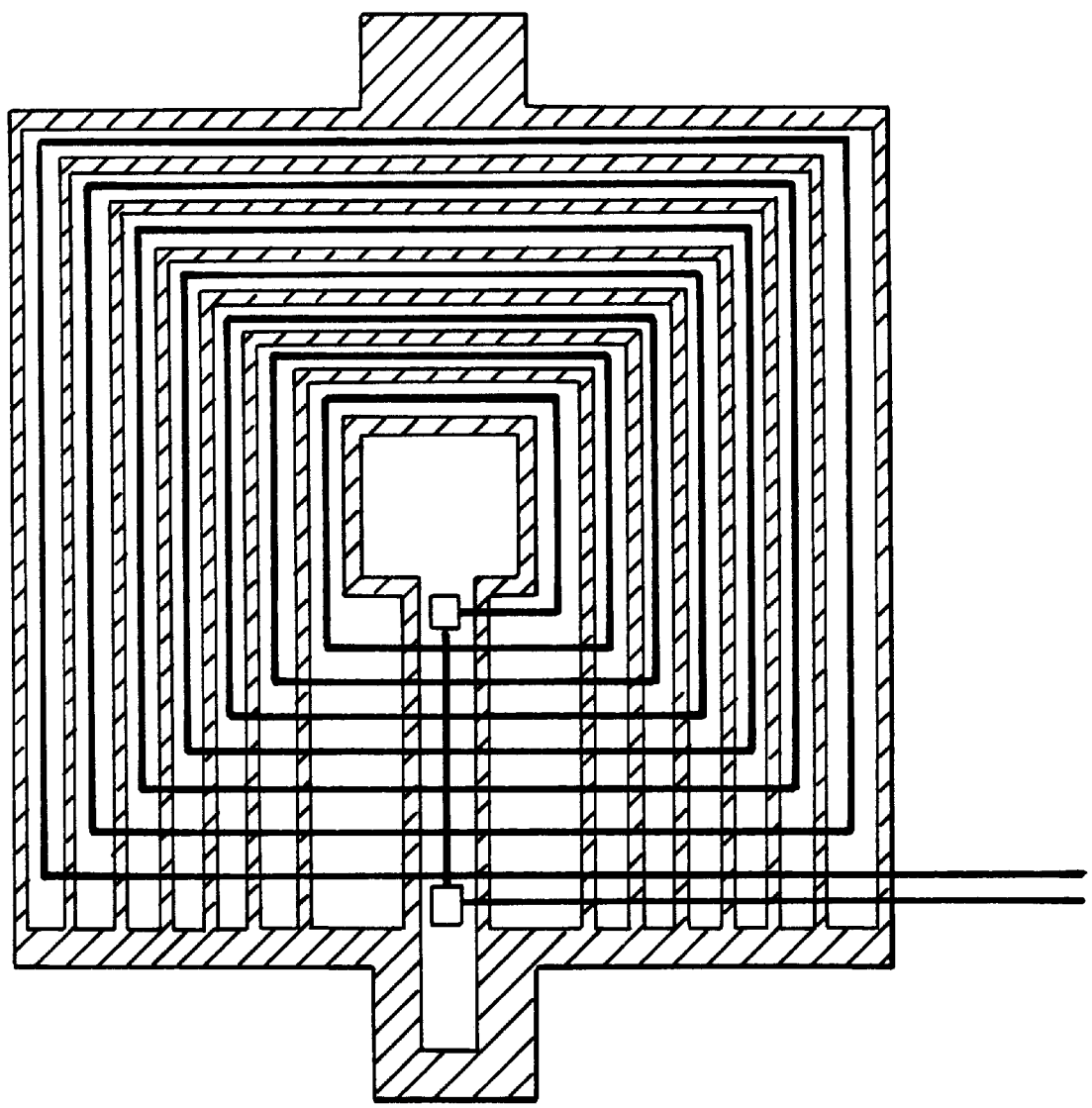
FIG. 10 shows a design of an input coil combined with an inventive SQUID body pattern to minimize parasitic capacitance.

FIG. 10 shows a configuration that minimizes the parasitic capacitance between an input coil and an inventive SQUID washer having parallel strips of narrow superconducting film, electrically connected in parallel. The turns of the input coil were placed inside the slots. Using this configuration, capacitance is reduced. Inductive coupling between this type of SQUID and the multiturn input coil is nearly as efficient as for a conventional device.

This inventive SQUID and input coil design is particularly important for radio-frequency SQUIDs, where parasitic capacitance can make the device inoperable at microwave pump frequencies, even using low signal frequencies. Further, this inventive design improves performance of low-$T_C$ SQUIDs at least as much as for high-$T_C$ SQUIDs.

EXAMPLE 11

Geophysics Applications

Magnetotellurics is a geophysical surveying method in which the components of fluctuating electric and magnetic fields at the surface of the Earth are measured to infer the resistivity of the ground as a function of position and depth at which the measurement is taken. High-$T_C$ superconducting three-axis SQUID magnetometers are attractive tools for measuring the magnetic fields, because they are smaller, lighter, and more sensitive over a larger bandwidth than conventional induction coil instruments. However, at low frequencies, for example at 1 Hz, excess noise resulting from the presence of the Earth's ambient magnetic field (about 50 µT) during cooling of the magnetometer, greatly decreases magnetic field resolution in high-$T_C$ SQUID magnetometers.

Using the inventive magnetometers it is possible to cool and operate a sensitive high-$T_C$ superconducting magnetometer in the Earth's magnetic field without a significant increase in the 1/f noise. Therefore the inventive magnetometers have sufficient magnetic field resolution in the unshielded environment.

EXAMPLE 12

Magnetocardiography

In the past, measurement of magnetic signals from human subjects had to be collected in costly and rare magnetically shielded rooms in order to exclude both ambient noise and the static Earth's magnetic field. The inventive magnetometer, using narrow-film-width SQUIDs, makes it possible to eliminate shielding for the static magnetic field component. However, shielding is still needed to eliminate noise arising from fluctuations in the magnetic field.

In summary, the present invention discloses a novel family of SQUID configurations that significantly reduce 1/f noise. The inventors discovered that a superconducting film having a width below a critical value, $w_C$, excludes magnetic flux vortices when operated in an ambient magnetic field, up to a threshold field magnitude. The discovery was used to make a number of useful superconducting devices in which the film widths were fabricated to be equal to or less than $w_C$, for a given ambient magnetic field. The invention is used in virtually all high-$T_C$ SQUIDs and SQUID-based devices that are operated in an ambient magnetic fields. Examples of such uses include geophysical measurements, nondestructive evaluation, amplifiers for nuclear magnetic resonance and nuclear quadrupole resonance, magnetocardiography, magnetoencephalography, and other research and diagnostic biomedical applications. The narrow superconducting film width microelectronic devices are useful for a wide range of analog and digital superconducting microelectronics in which it is desirable to eliminate magnetic flux vortex motion. Reduction in parasitic capacitance is expected to be particularly useful in wireless communication, especially in the radio frequency and microwave frequency regions. The inventive SQUID body formed from one or more superconducting film strips wherein the strip width does not exceed $w_C$ is equally useful for dc, rf, and other devices that are operated in an ambient magnetic field.

The description of illustrative embodiments and best modes of the present invention is not intended to limit the scope of the invention. Various modifications, alternative constructions and equivalents may be employed without departing from the true spirit and scope of the appended claims.

What is claimed is:

1. A high-transition-temperature superconducting device for operation in an ambient magnetic field comprising, a superconducting film wherein the film has a width that is equal to or less than a critical width, the critical width being that width at which magnetic flux vortices are excluded from the superconducting film at a particular ambient magnetic field.

2. The device of claim 1 wherein the film width is between about 0.01 and about 1 times the critical width.

3. The device of claim 1 wherein the film width is between about 0.1 and about 0.9 times the critical width.

4. The device of claim 1 wherein the film width is between about 0.5 and about 1 times the critical width.

5. The device of claim 1 wherein the film width is between about 4 µm and about 30 µm.

6. The device of claim 1 wherein the film width is between about 1 µm and about 8 µm.

7. The device of claim 1 further comprising a plurality of film strips formed from the high-$T_C$ superconducting film, wherein the strips have widths between about 0.01 times and about 1 times the critical width.

8. The device of claim 7 wherein the film strip widths vary ±45%.

9. The device of claim 7 wherein the film strip widths vary ±5%.

10. A high-transition-temperature superconducting quantum interference device (SQUID), for operation in an ambient magnetic field, the SQUID having a body comprising: a continuous strip of superconducting film interrupted by at least one Josephson junction, the strip having a width that is less than or equal to a critical width, wherein the critical width is that width at which magnetic flux vortices are excluded from the superconducting film at a particular magnetic field.

11. The SQUID device of claim 10 wherein the width of the film strip is uniform, within ±45.

12. The SQUID device of claim 10 wherein the width of the film strip is uniform, within ±5.

13. The SQUID device of claim 10 wherein the width of the film strip varies and remains within between about 0.01 and about 1 times the critical width.

14. The SQUID device of claim 11 wherein the average film width is between about 0.5 times and about 1 times the critical width.

15. The SQUID device of claim 10 wherein the width of the film strip is between about 2 µm and about 13 µm.

16. A high-transition-temperature superconducting quantum interference device (SQUID) for operation in an ambient magnetic field, the SQUID having a body comprising: at least one continuous strip of superconducting film, interrupted by at least one Josephson junction, the strip having a width that is equal to or less than a critical width, the critical width being that width at which magnetic flux vortices are excluded from the superconducting film at a particular magnetic field.

17. The SQUID device of claim 16 wherein the SQUID body comprises a plurality of film strips, electrically connected in parallel.

18. The SQUID device of claim 16 wherein the film width of individual strips is between about 0.01 and about 1 times the critical width.

19. The SQUID device of claim 16 wherein the film width of individual strips is between about 0.1 and about 1 times the critical width.

20. The SQUID device of claim 16 wherein the film width of individual strips is between about 0.5 and about 0.9 times the critical width.

21. The SQUID device of claim 16 wherein the film width of individual strips varies from one to another and the width of any one strip is constant ±45%.

22. The SQUID device of claim 21 wherein the film width of individual strips varies from one to another and the width of any one strip is constant ±5%.

23. The SQUID device of claim 16 wherein the film width of individual strips is constant ±45%.

24. The SQUID device of claim 23 wherein the film width of individual strips is constant ±5.

25. The device of claim 16 wherein the film width is between about 4 $\mu$m and about 13 $\mu$m.

26. The device of claim 16 wherein the film width is between about 1 $\mu$m and about 8 $\mu$m.

27. The device of claim 16 further comprising film strips greater than the critical width located more than 50 $\mu$m away from the central slot.

28. A high-transition-temperature superconducting magnetometer for operation in a magnetic field, comprising,
   a) a SQUID having a body comprising, a plurality superconducting film strips, the film strips having a width that is equal to or less than a critical width, the critical width being that width at which flux noise is excluded from the superconducting film at a particular ambient magnetic field;
   b) a thin dielectric coating over the SQUID; and
   c) a flux transformer comprising a pickup coil and an input coil deposited on the dielectric coating and inductively coupled to the SQUID.

29. The device of claim 28 wherein the strips comprising the input coil are staggered to lie in the openings between the strips that form the SQUID body.

30. The device of claim 28 wherein the SQUID body comprises at least two film strips.

31. The magnetometer device of claim 28 wherein the film width is between about 0.1 times and about 1 times the critical width.

32. The device of claim 28 wherein the film width is between about 2 $\mu$m and about 13 $\mu$m.

33. A directly coupled high-$T_C$ superconducting magnetometer for operation in a magnetic field comprising,
   a) a SQUID having a body comprising, at least one continuous high-$T_C$ superconducting film strip interrupted by at least one Josephson junction, the at least one film strip having a width that is equal to or less than a critical width, the critical width being that width at which flux noise is excluded from the superconducting film at a particular ambient magnetic field;
   b) a pick up coil having two ends, each end electrically connected to the SQUID body.

34. A method of measuring magnetic field or flux comprising the steps of,
   a) providing a superconducting magnetometer comprising at least one SQUID having a body wherein all film strip widths are less than or equal to a critical width, the critical width being that width at which flux noise is excluded from the superconducting film at a particular ambient magnetic field;
   b) providing the electronics necessary to read out magnetometer signals arising from magnetic field flux;
   c) cooling the magnetometer to below it's superconducting transition temperature; and
   d) reading out the signals produced by the magnetometer.

* * * * *